United States Patent
Abla et al.

(10) Patent No.: US 10,423,693 B2
(45) Date of Patent: Sep. 24, 2019

(54) PARALLEL PROCESSING USING A BOTTOM UP APPROACH

(71) Applicant: Autodesk, Inc., San Rafael, CA (US)

(72) Inventors: Timothy E. Abla, Pinckney, MI (US); Michael Alan Foster, Novi, MI (US); John T. Koerner, South Lyon, MI (US); Mikel L. Martin, South Lyon, MI (US); Dennis M. Mulonas, Commerce Township, MI (US); Matthew W. Smith, Plymouth, MI (US)

(73) Assignee: AUTODESK, INC., San Rafael, CA (US)

( * ) Notice: Subject to any disclaimer, the term of this patent is extended or adjusted under 35 U.S.C. 154(b) by 436 days.

(21) Appl. No.: 14/486,668

(22) Filed: Sep. 15, 2014

(65) Prior Publication Data

US 2016/0078118 A1 Mar. 17, 2016

(51) Int. Cl.
*G06F 17/00* (2019.01)
*G06F 17/10* (2006.01)
*G06F 9/50* (2006.01)
*G06F 17/50* (2006.01)

(52) U.S. Cl.
CPC ............ *G06F 17/10* (2013.01); *G06F 9/5066* (2013.01); *G06F 17/50* (2013.01); *G06F 2209/5017* (2013.01)

(58) Field of Classification Search
CPC ........... G06F 17/5081; G06F 17/30592; G06F 2216/03; G06F 17/30938; G06F 17/30489; G06F 17/30705; G06F 9/542; Y10S 707/99933; Y10S 707/99956; Y10S 707/99942

See application file for complete search history.

(56) References Cited

U.S. PATENT DOCUMENTS

| | | | |
|---|---|---|---|
| 4,694,404 A | 9/1987 | Meagher | |
| 5,280,547 A * | 1/1994 | Mahoney | G06K 9/4638 382/226 |
| 5,634,113 A * | 5/1997 | Rusterholz | G06F 17/509 716/106 |
| 6,154,213 A | 11/2000 | Rennison et al. | |

(Continued)

OTHER PUBLICATIONS

Supporting Frequent Updates in R-Trees: A Bottom-Up Approach, Lee et al, Proceedings of the 29th VLDB Conference, Berlin, Germany, 2003.*

(Continued)

*Primary Examiner* — Augustine K. Obisesan
(74) *Attorney, Agent, or Firm* — Gates & Cooper LLP

(57) ABSTRACT

A method, apparatus, system, computer program product, and computer readable storage medium provide the ability to parallel process hierarchical data. Hierarchical data is obtained. The hierarchical data is organized in a relationship graph having two or more nodes (consisting of parent nodes that are dependent on child nodes). The relationship graph requires bottom-up processing. Cycles are identified in the relationship graph. The relationship graph is leveled by traversing the graph and assigning all graph nodes into levels. The hierarchical data is processed by parallel processing the nodes in a first level of the one or more levels before parallel processing the nodes in a subsequent level.

18 Claims, 20 Drawing Sheets

(56) References Cited

U.S. PATENT DOCUMENTS

| | | | | |
|---|---|---|---|---|
| 6,681,242 | B1* | 1/2004 | Kumar | G06F 9/52 709/223 |
| 7,913,209 | B1* | 3/2011 | Wu | G06F 17/5045 703/14 |
| 2006/0282437 | A1* | 12/2006 | Balasubramanian | G06Q 10/10 |
| 2006/0282439 | A1* | 12/2006 | Allen | G06F 17/30979 |
| 2008/0010304 | A1* | 1/2008 | Vempala | G06F 17/3071 |
| 2009/0176404 | A1* | 7/2009 | Follingstad | H01R 13/518 439/534 |
| 2009/0327195 | A1* | 12/2009 | Iscen | G06N 5/042 706/47 |
| 2010/0189353 | A1* | 7/2010 | Perry | G06F 3/018 382/179 |
| 2010/0274818 | A1* | 10/2010 | Chauvin | G06F 16/9024 707/803 |
| 2011/0131199 | A1* | 6/2011 | Simon | G06F 17/30463 707/714 |
| 2013/0235049 | A1 | 9/2013 | Karras | |
| 2015/0161622 | A1* | 6/2015 | Hoffmann | G06Q 30/0185 705/318 |

OTHER PUBLICATIONS

Stream Processing of XPath Queries with Predicates, Gupta et al, SIGMOD 2003, Jun. 9-12, 2003.*

Ecient Processing of Expressive Node-Selecting Queries on XML Data in Secondary Storage: A Tree Automata-based Approach, Proceedings of the 29th VLDB Conference, Berlin, Germany, 2003.*

Twig2Stack: Bottomup Processing of GeneralizedTreePattern Queries over XML Documents, Chen et al, VLDB '06, Sep. 1215, 2006.*

International Search Report and Written Opinion dated Dec. 29, 2015 for PCT Application No. PCT/US2015/49786.

Extended European Search Report dated Oct. 10, 2017 for European Patent Application No. 15841369.0.

Sadek, R. "Automatic Parallelism for Dataflow Graphs", Audio Engineering Society Convention Paper 8259, 129th Convention, Nov. 4-7, 2010, San Francisco, CA, USA, pp. 1-6.

Kramer, R., et al., "The Combining DAG: A Technique for Parallel Data Flow Analysis", IEEE Transactions on Parallel and Distributed Systems, Aug. 1994, pp. 805-813, vol. 5, No. 8, New York, USA.

* cited by examiner

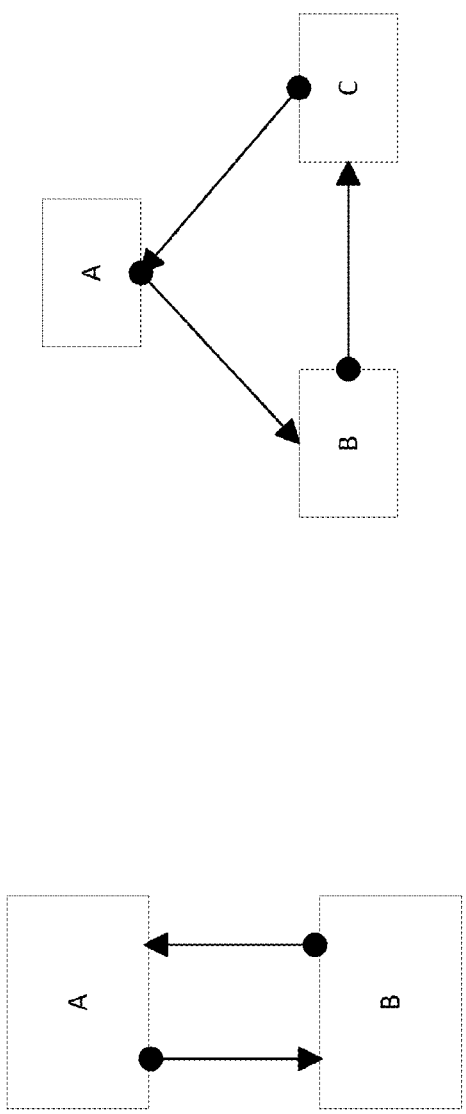

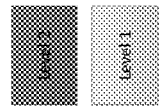
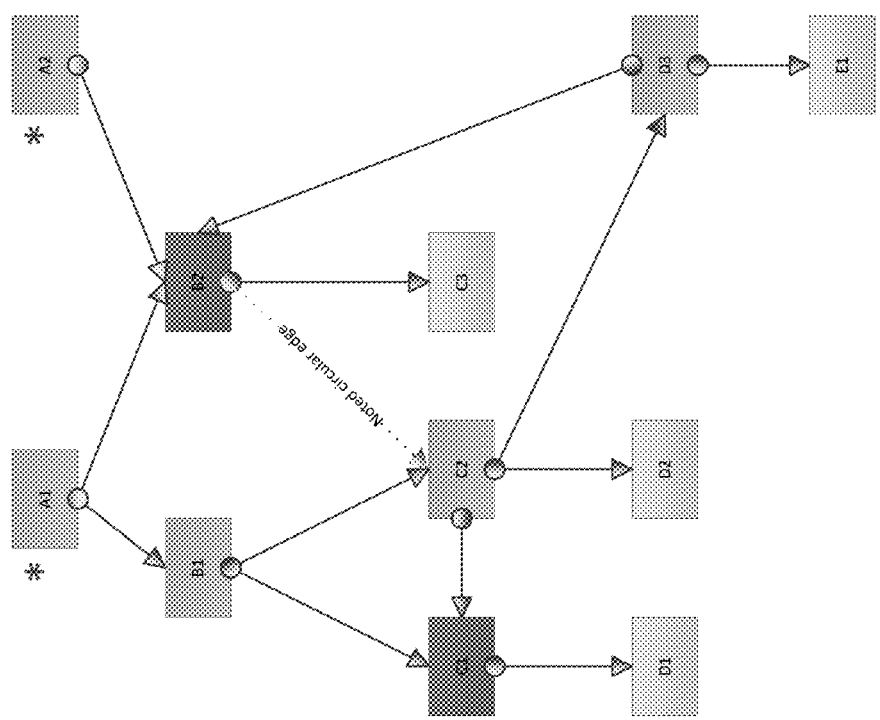
FIG. 9C
* Denotes root vertex

* Denotes root vertex

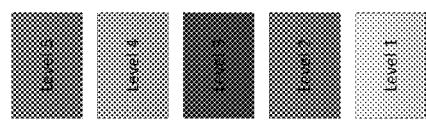
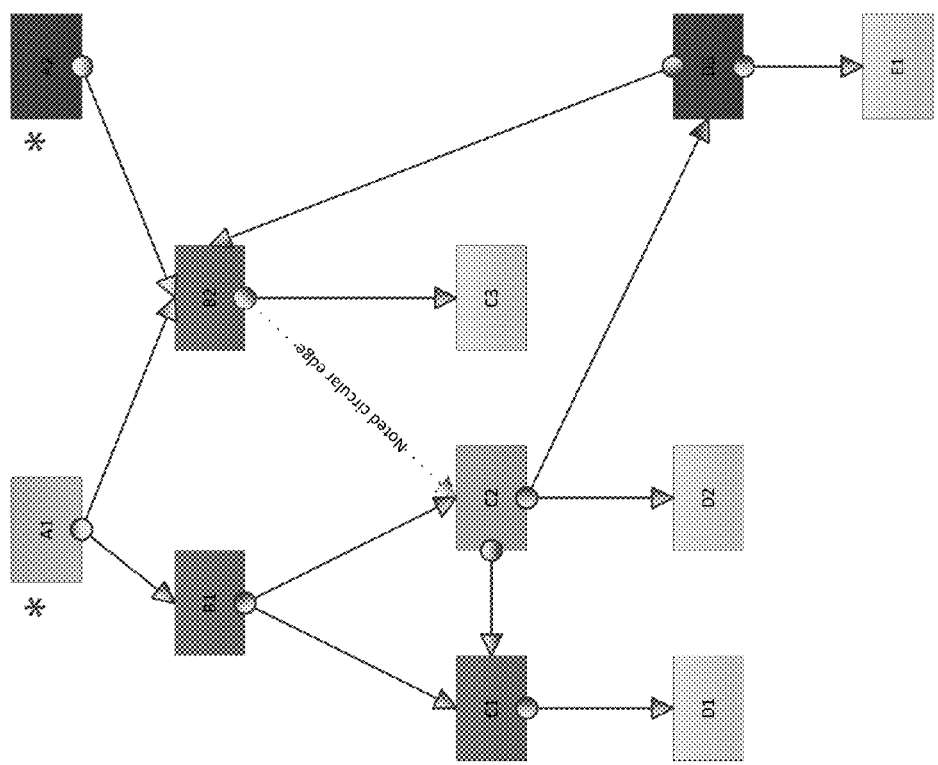
FIG. 9F
✻ Denotes root vertex

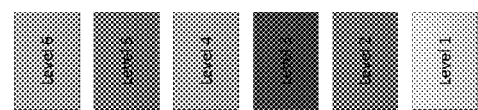
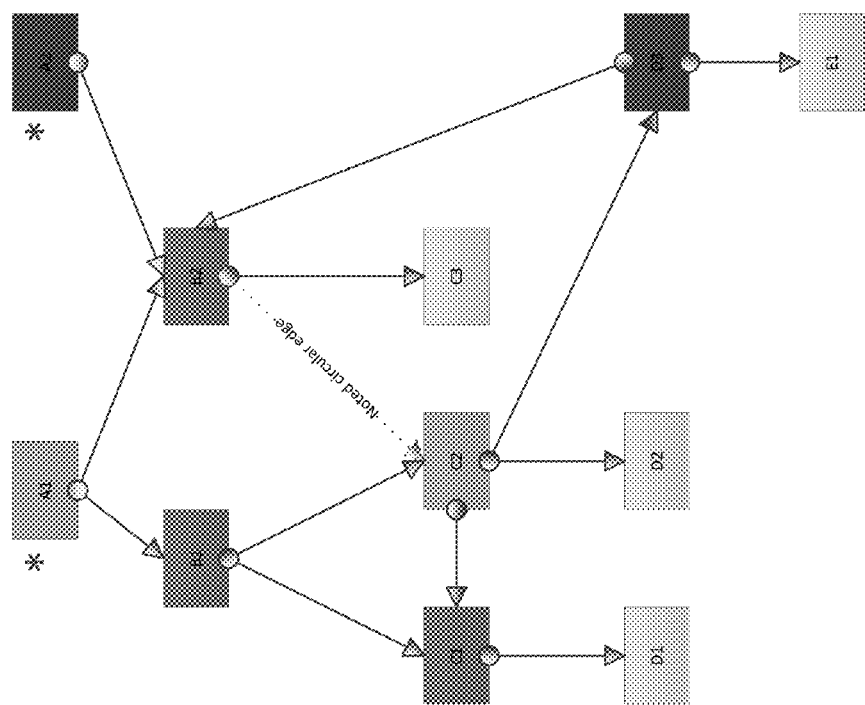
FIG. 9G
✲ Denotes root vertex

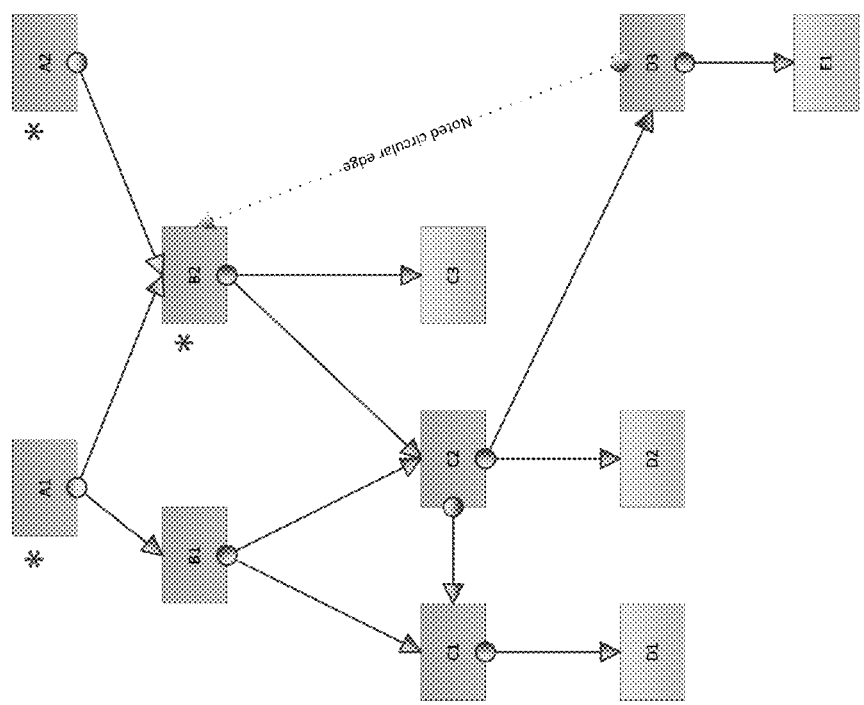
FIG. 10B
* Denotes root vertex

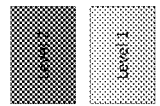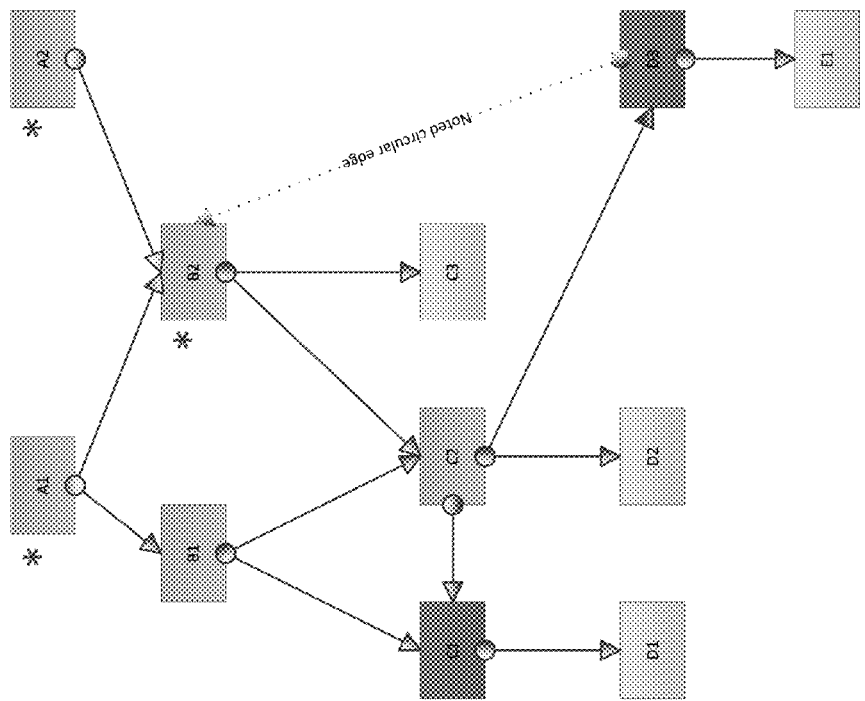
FIG. 10C
\* Denotes root vertex

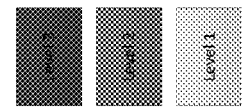
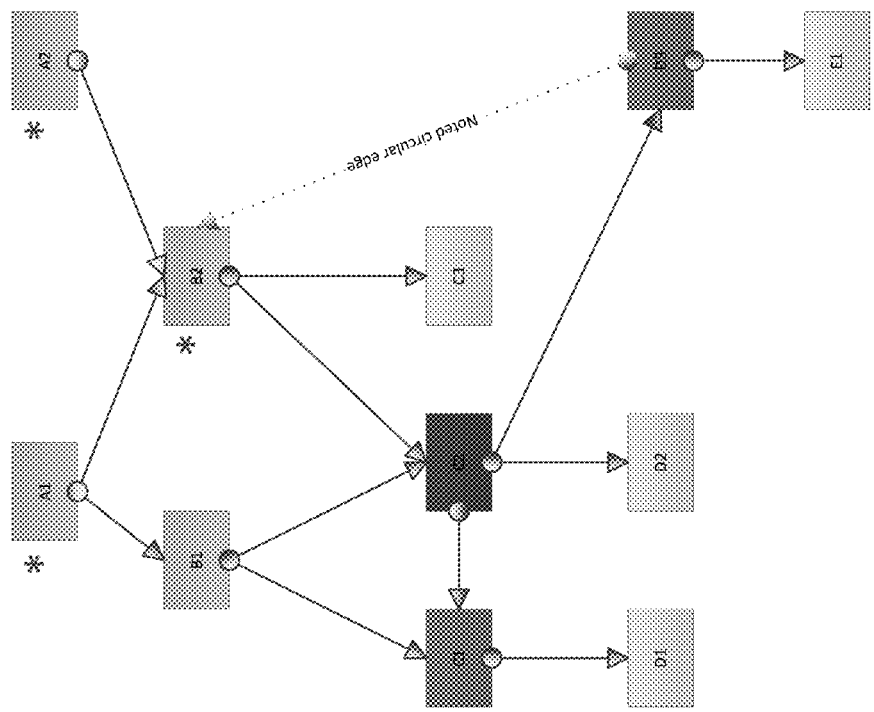
FIG. 10D

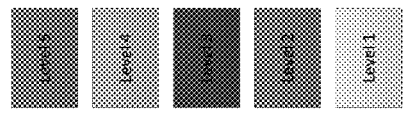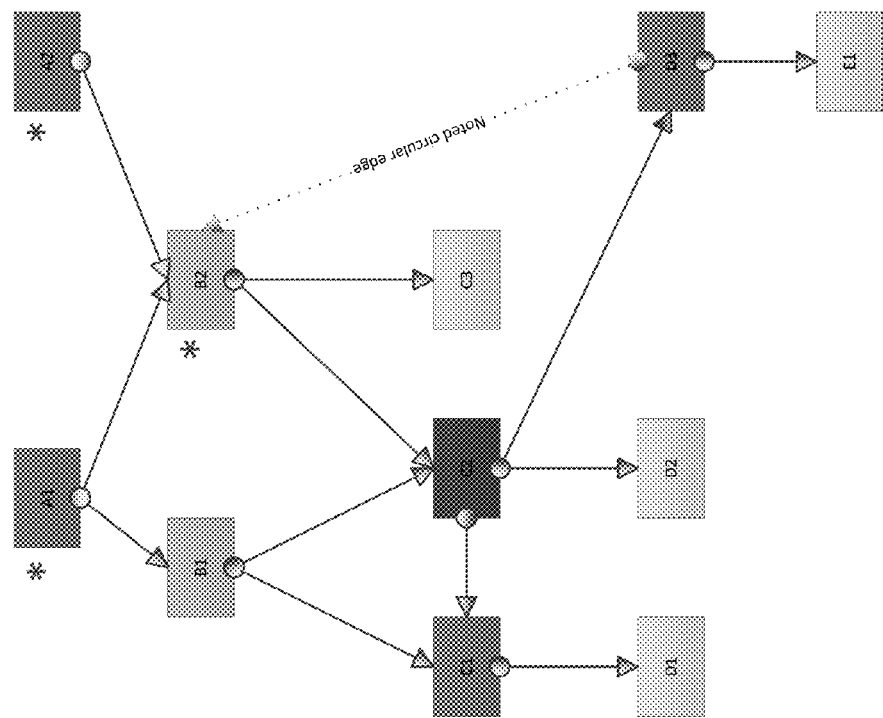
FIG. 10F

PARALLEL PROCESSING USING A BOTTOM UP APPROACH

BACKGROUND OF THE INVENTION

1. Field of the Invention

The present invention relates generally to data processing, and in particular, to a method, apparatus, and article of manufacture for processing a large amount of hierarchical data in a design set that requires bottom-up processing.

2. Description of the Related Art

When working with large amount of hierarchical data, it can be useful to perform operations on several nodes in parallel—primarily to increase performance. In particular, when working in data management, often times, design sets/assemblies have a large amount of data with dependencies on each other (e.g., multiple files that relate to each other). It is desirable to quickly and efficiently process such design sets while maintaining the integrity of the data. To maintain a data set's integrity, in certain scenarios, it is important that the data be processed from a "bottom-up" approach such that a node cannot be processed until all of the node's dependencies (i.e., children) are processed. For example, with an assembly data set, one needs to ensure that all of an assembly's children are checked in before the assembly is checked in. Similarly, before checking in a child, the child's children must also be checked in first. If such a bottom-up approach is not conformed to, the resulting data set may be incomplete and/or corrupt. Further, the need to process the dependencies first makes it extremely difficult to process the nodes in a parallel manner in all but the simplest structures.

To better understand the problems of the prior art, a description of various graphs/hierarchical structures may be useful.

FIG. 1 illustrates graph terminology as used herein. A first vertex or node 102 (e.g., a file) has a directional edge (e.g., a relationship) with a second vertex or node 104. As illustrated, vertex 102 is dependent on vertex 104. In other words, vertex 104 is a child of vertex 102.

FIGS. 2A and 2B illustrate simple graphs with cycles. In FIG. 2A, node A is dependent on node B and vice versa (creating a cyclical dependency). Similarly, in FIG. 2B, node A is dependent on node B which is dependent on node C which is dependent on node A.

FIG. 3 illustrates a complex graph with a cycle representing a dataset. As an example, each of the boxes in FIG. 3 may represent files in a design set. More specifically, if designing a table, box A1 may represent the table assembly itself, box B1 may represent the table top, box C1 may represent brackets, and other boxes may represent screws, legs, etc. Each box may also have sub-assemblies (e.g., that define a table leg).

When processing the assembly (e.g., when pushing to a central repository or pulling down from a repository), the processing must be performed in a bottom-up manner. In a bottom-up prior art system, the graph is first analyzed and then the processing order is determined. Thus, D1, D2, and E1 may be added/processed/uploaded first. Thereafter, prior art systems may serially process each parent node. In systems requiring a bottom-up approach, prior art systems often "walked" or traversed a graph/structure multiple times. It is desirable to determine how to process/upload more than one file at a time (e.g., to improve performance). Prior art systems fail to provide a reliable and efficient system for analyzing and parallel processing such a complex graph.

SUMMARY OF THE INVENTION

Embodiments of the invention sort the data into groups that are processed in a parallel manner. The sorting guarantees that all dependencies of a node will have been processed before the node itself as long as the groups are processed in their entirety and in the correct order. More specifically, all nodes in a group can be processed in parallel because nodes contained in a single group do not depend on anything within that group. Therefore, order within a group is irrelevant.

BRIEF DESCRIPTION OF THE DRAWINGS

Referring now to the drawings in which like reference numbers represent corresponding parts throughout:

FIG. 1 illustrates graph terminology;

FIGS. 2A and 2B illustrate simple graphs with cycles;

FIGS. 9A-9G and 10A-10F illustrate exemplary leveling processes performed on the graph of FIG. 3 in accordance with one or more embodiments of the invention.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention provide the ability to parallel process a large set of hierarchical design data that contains circular references. The post processing sorting is performed in ways that allow for processing of an entire group in parallel. Further, the sorting methodology handles circular dependencies in a way that still allows for parallel processing of all components, including those involved in the circular reference. In addition, the methodology finds/identifies circular references in an efficient manner during the sorting process.

Hardware Environment

Figure 4:
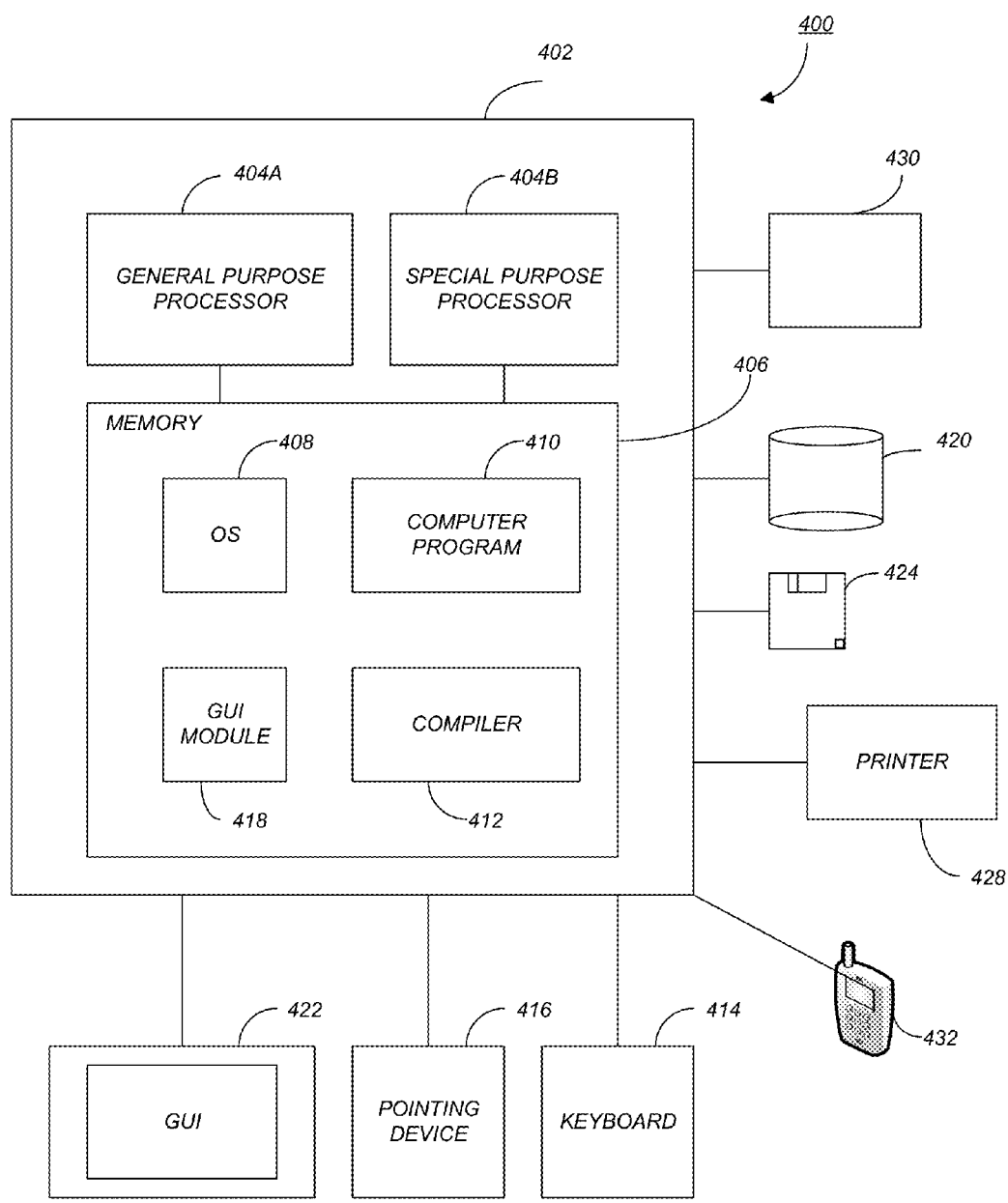
FIG. 4 is an exemplary hardware and software environment used to implement one or more embodiments of the invention.

FIG. 4 is an exemplary hardware and software environment 400 used to implement one or more embodiments of the invention. The hardware and software environment includes a computer 402 and may include peripherals. Computer 402 may be a user/client computer, server computer, or may be a database computer. The computer 402 comprises a general purpose hardware processor 404A and/or a special purpose hardware processor 404B (hereinafter alternatively collectively referred to as processor 404) and a memory 406, such as random access memory (RAM). The computer 402 may be coupled to, and/or integrated with, other devices, including input/output (I/O) devices such as a keyboard 414, a cursor control device 416 (e.g., a mouse, a pointing device, pen and tablet, touch screen, multi-touch device, etc.) and a printer 428. In one or more embodiments, computer 402 may be coupled to, or may comprise, a portable or media viewing/listening device 432 (e.g., an MP3 player, iPod™, Nook™, portable digital video player, cellular device, personal digital assistant, etc.). In yet another embodiment, the computer 402 may comprise a multi-touch device, mobile phone, gaming system, internet enabled television, television set top box, or other internet enabled device executing on various platforms and operating systems.

In one embodiment, the computer 402 operates by the general purpose processor 404A performing instructions defined by the computer program 410 under control of an operating system 408. The computer program 410 and/or the operating system 408 may be stored in the memory 406 and may interface with the user and/or other devices to accept input and commands and, based on such input and commands and the instructions defined by the computer program 410 and operating system 408, to provide output and results.

Output/results may be presented on the display 422 or provided to another device for presentation or further processing or action. In one embodiment, the display 422 comprises a liquid crystal display (LCD) having a plurality of separately addressable liquid crystals. Alternatively, the display 422 may comprise a light emitting diode (LED) display having clusters of red, green and blue diodes driven together to form full-color pixels. Each liquid crystal or pixel of the display 422 changes to an opaque or translucent state to form a part of the image on the display in response to the data or information generated by the processor 404 from the application of the instructions of the computer program 410 and/or operating system 408 to the input and commands. The image may be provided through a graphical user interface (GUI) module 418. Although the GUI module 418 is depicted as a separate module, the instructions performing the GUI functions can be resident or distributed in the operating system 408, the computer program 410, or implemented with special purpose memory and processors.

In one or more embodiments, the display 422 is integrated with/into the computer 402 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 402 according to the computer program 410 instructions may be implemented in a special purpose processor 404B. In this embodiment, the some or all of the computer program 410 instructions may be implemented via firmware instructions stored in a read only memory (ROM), a programmable read only memory (PROM) or flash memory within the special purpose processor 404B or in memory 406. The special purpose processor 404B may also be hardwired through circuit design to perform some or all of the operations to implement the present invention. Further, the special purpose processor 404B may be a hybrid processor, which includes dedicated circuitry for performing a subset of functions, and other circuits for performing more general functions such as responding to computer program 410 instructions. In one embodiment, the special purpose processor 404B is an application specific integrated circuit (ASIC).

The computer 402 may also implement a compiler 412 that allows an application or computer program 410 written in a programming language such as COBOL, Pascal, C++, FORTRAN, or other language to be translated into processor 404 readable code. Alternatively, the compiler 412 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 410 accesses and manipulates data accepted from I/O devices and stored in the memory 406 of the computer 402 using the relationships and logic that were generated using the compiler 412.

The computer 402 also optionally comprises an external communication device such as a modem, satellite link, Ethernet card, or other device for accepting input from, and providing output to, other computers 402.

In one embodiment, instructions implementing the operating system 408, the computer program 410, and the compiler 412 are tangibly embodied in a non-transitory computer-readable medium, e.g., data storage device 420, which could include one or more fixed or removable data storage devices, such as a zip drive, floppy disc drive 424, hard drive, CD-ROM drive, tape drive, etc. Further, the operating system 408 and the computer program 410 are comprised of computer program 410 instructions which, when accessed, read and executed by the computer 402, cause the computer 402 to perform the steps necessary to implement and/or use the present invention or to load the program of instructions into a memory 406, thus creating a special purpose data structure causing the computer 402 to operate as a specially programmed computer executing the method steps described herein. Computer program 410 and/or operating instructions may also be tangibly embodied in memory 406 and/or data communications devices 430, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 402.

Figure 5:
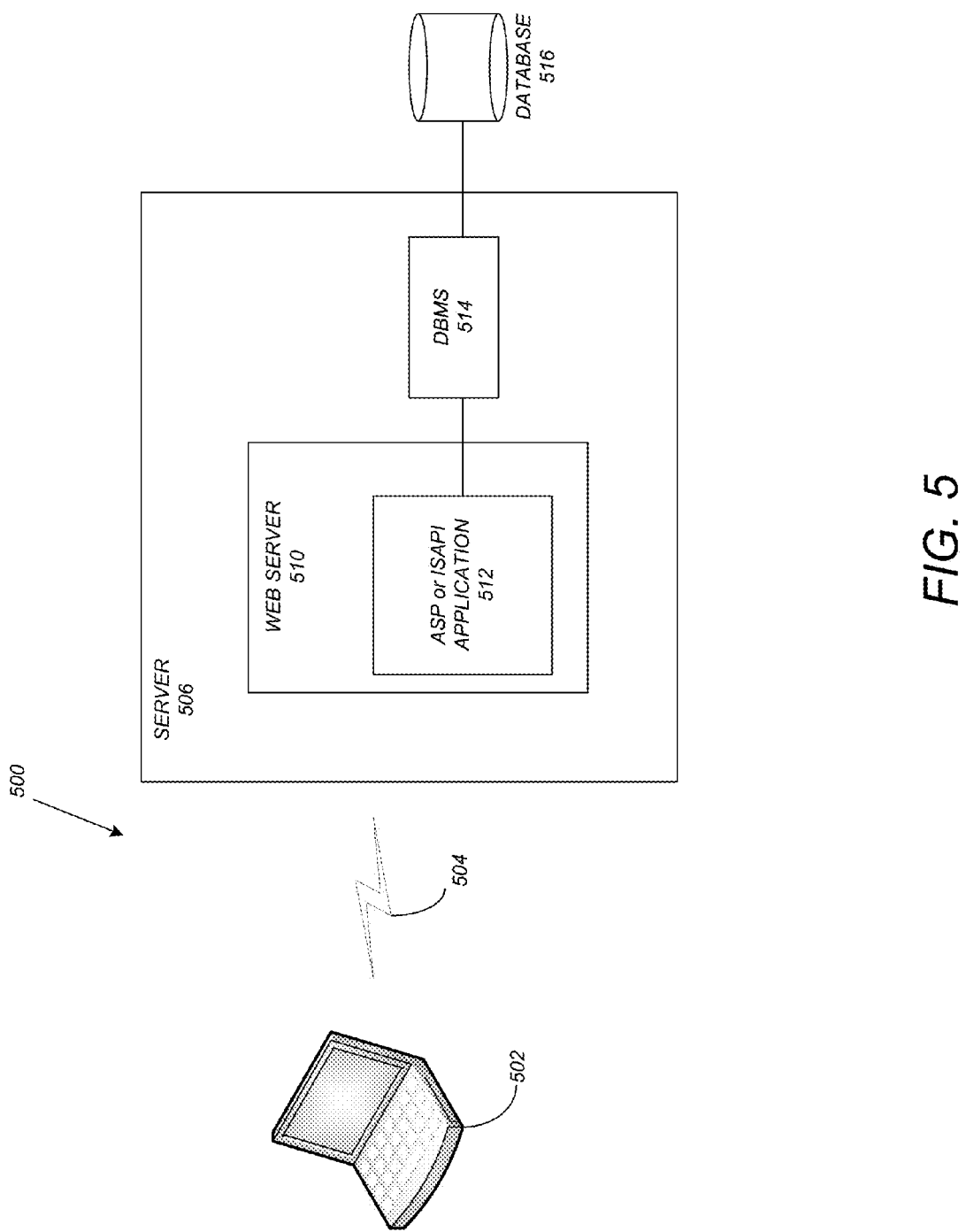
FIG. 5 schematically illustrates a typical distributed computer system using a network to connect client computers to server computers in accordance with one or more embodiments of the invention.

FIG. 5 schematically illustrates a typical distributed computer system 500 using a network 504 to connect client computers 502 to server computers 506. A typical combination of resources may include a network 504 comprising the Internet, LANs (local area networks), WANs (wide area networks), SNA (systems network architecture) networks, or the like, clients 502 that are personal computers or workstations (as set forth in FIG. 4), and servers 506 that are personal computers, workstations, minicomputers, or mainframes (as set forth in FIG. 4). However, it may be noted that different networks such as a cellular network (e.g., GSM [global system for mobile communications] or otherwise), a satellite based network, or any other type of network may be used to connect clients 502 and servers 506 in accordance with embodiments of the invention.

A network 504 such as the Internet connects clients 502 to server computers 506. Network 504 may utilize ethernet, coaxial cable, wireless communications, radio frequency (RF), etc. to connect and provide the communication between clients 502 and servers 506. Clients 502 may execute a client application or web browser and communicate with server computers 506 executing web servers 510. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 502 may be downloaded from server computer 506 to client computers 502 and installed as a plug-in or ACTIVEX™ control of a web browser. Accordingly, clients 502 may utilize ACTIVEX™ components/component object model (COM) or distributed COM (DCOM) components to provide a user interface on a display of client 502. The web server 510 is typically a program such as MICROSOFT'S INTERNET INFORMATION SERVER™.

Web server 510 may host an Active Server Page (ASP) or Internet Server Application Programming Interface (ISAPI) application 512, which may be executing scripts. The scripts invoke objects that execute business logic (referred to as business objects). The business objects then manipulate data in database 516 through a database management system (DBMS) 514. Alternatively, database 516 may be part of, or connected directly to, client 502 instead of communicating/obtaining the information from database 516 across network 504. When a developer encapsulates the business functionality into objects, the system may be referred to as a component object model (COM) system. Accordingly, the scripts executing on web server 510 (and/or application 512) invoke COM objects that implement the business logic. Further, server 506 may utilize MICROSOFT'S™ Transaction Server (MTS) to access required data stored in database 516 via an interface such as ADO (Active Data Objects), OLE DB (Object Linking and Embedding DataBase), or ODBC (Open DataBase Connectivity).

Generally, these components 500-516 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 502 and 506 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 502 and 506.

Software Embodiment Overview

Embodiments of the invention are implemented as a software application on a client 502 or server computer 506. Further, as described above, the client 502 or server computer 506 may comprise a thin client device or a portable device that has a multi-touch-based display.

To overcome the deficiencies of the prior art and efficiently parallel process hierarchical data, hierarchical data is obtained. Such hierarchical data is organized in a relationship graph having two or more nodes (including parent node(s) that are dependent on child node(s)) wherein bottom-up processing of the graph is required (e.g., before processing a first parent node all dependent children of the first parent node are/must be processed). As descried herein, the hierarchical data can be any hierarchical data (with dependency relationships) including a product design data set such as a solid modeling assembly.

Figure 6:
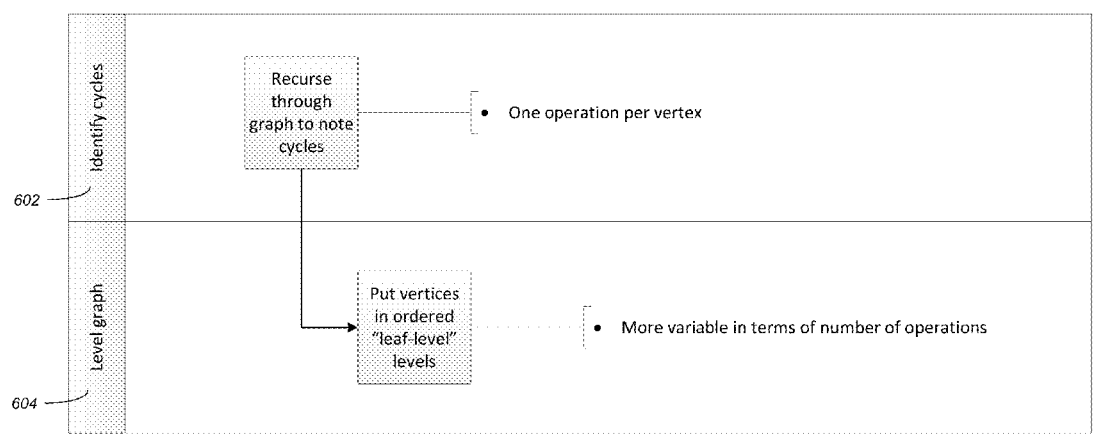
FIG. 6 illustrates a high level flow for leveling a graph with cycles in accordance with one or more embodiments of the invention.

FIG. 6 illustrates a high level flow for leveling a graph with cycles in accordance with one or more embodiments of the invention. There are two stages—identify cycles stage 602 and the level graph stage 604. In the identify cycles stage 602, a method recurses through a graph to note/identify any cycles. One operation per vertex is performed. Once all of the cycles (i.e., circular dependencies) have been identified in stage 602, the vertices of the resulting graph are placed into ordered "leaf-level" levels in the level graph stage 604. Thus, in stage 604, the vertices/nodes of the graph are put into different levels/groups. Stage 604 is more variable in terms of the number of operations that may be performed. Each of the nodes in a level/group may be processed in parallel.

Figure 7:
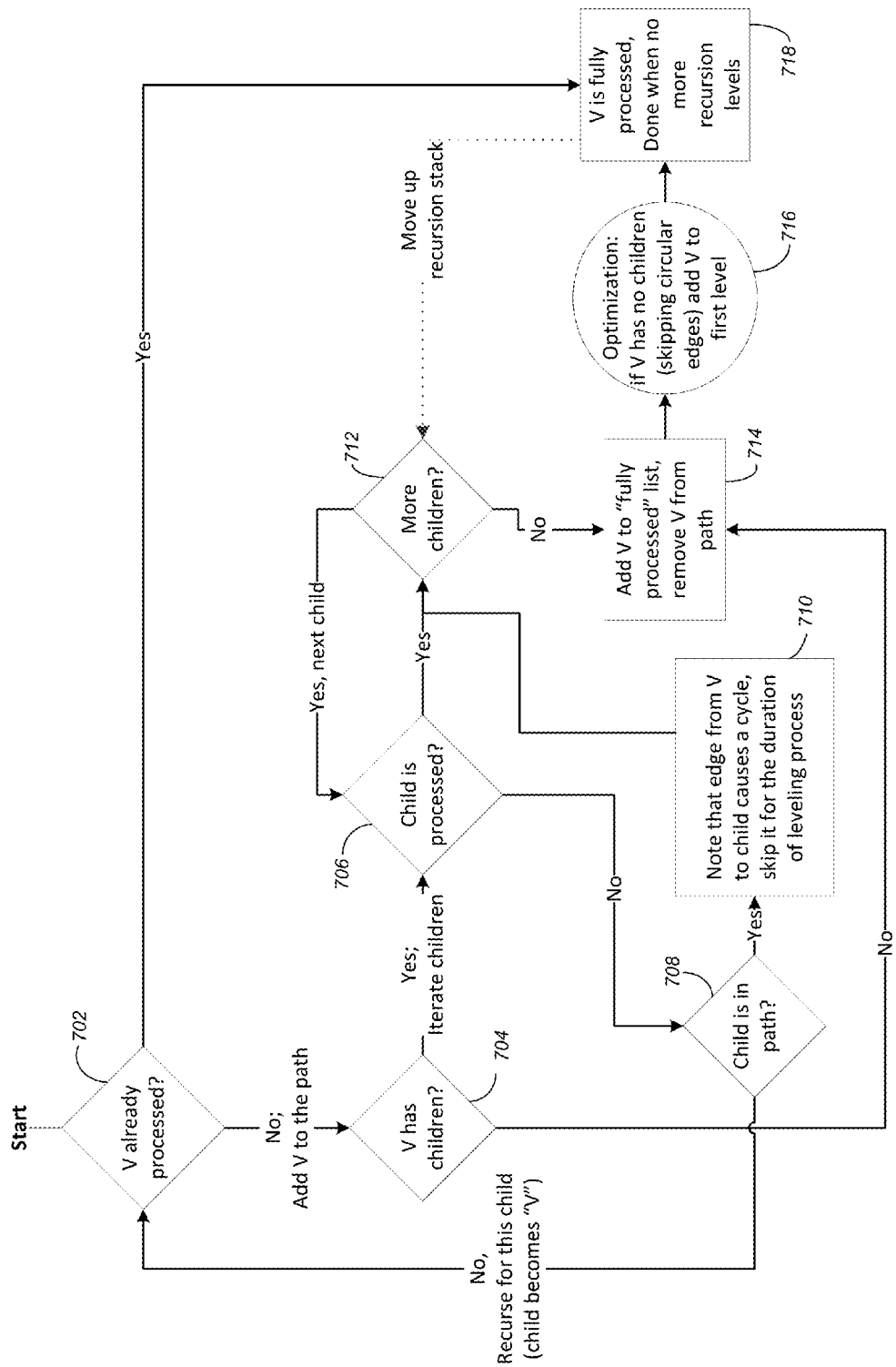
FIG. 7 illustrates the process for identifying cycles for each given root vertex "V" in accordance with one or more embodiments of the invention.

Details regarding the process performed in the identifying cycles stage 602 are set forth in FIG. 7. In this regard, FIG. 7 illustrates the process for identifying cycles for each given root vertex/node "V". In other words, root vertices (also referred to herein as nodes) are identified and FIG. 7 illustrates the process for identifying cycles for each root vertex. It may be noted that root vertices are not limited to only the logical root nodes of a graph.

As used herein, a node/vertex is "fully processed" when the vertex and all of its children have been analyzed and any cycles have been noted. A "path" refers to the path from the current root vertex to the current vertex. A vertex cannot be fully processed if it is in the path.

The process begins at 702 where a determination is made regarding whether the vertex V has already been processed. A vertex may have already been processed in the case of root vertices if the root vertex is a child of a previously handled root vertex (e.g., referring to FIG. 3, if given roots A1, A2, and B2 in that order, B2 would be already processed when it is handled). If the vertex V has already been fully processed, identification of cycles for each given root vertex is complete when there are no more recursion levels to examine (at step 718). If V has not already been processed, V is added to the path (i.e., from the current root vertex to the current vertex), and a determination is made at 704 regarding whether V has any children. If V has children, steps 706-712 are performed for each child (i.e., steps 706-712 are iterated for each child vertex).

At step 706, a determination is made regarding whether the child has been processed. If not, a determination is made if the child is in V's path at step 708. If the child is not in V's path, the process recurses at step 702 with the child becoming vertex V. If the child is in V's path, a cycle exists and at step 710, the edge from V to the child is noted as causing a cycle, and is skipped for the duration of the leveling process (i.e., step 604 of FIG. 6). Once the child has been processed, a determination is made at step 712 regarding whether more children of V exist, and if so, the process returns to step 706. Thus, step 712 enables the iteration over each of V's children vertices. If no more children exist, V is added to the "fully processed" list and removed from the path (from the current root vertex to the current vertex).

At step 716, optimization is performed. In this regard, if V has no children (skipping circular edges) (i.e., V is a leaf node), V is added to the first level/group. Thus, step 716 creates the first level/group that consists of all of the leaf nodes. At step 718, V has been fully processed, and the process is complete when there are no more recursion levels. If more recursion levels exist, the process moves up the recursion stack and returns to step 712.

In view of the above, the steps of FIG. 7 provide for: selecting a node; determining that the selected node has not yet been processed; adding the selected node to a path (from the current root node to the selected node); for each child of the selected node, if the child node is in the path, noting that an edge from the selected node to the child node causes a cycle, and skipping the child node during the leveling of the graph; and adding the selected node to a list of fully processed nodes, removing the selected node from the path, and repeating the above steps for a remaining node that is not in the list of fully processed nodes. In addition, if the selected node does not have any child nodes, the selected node is added to a first level.

Figure 8:
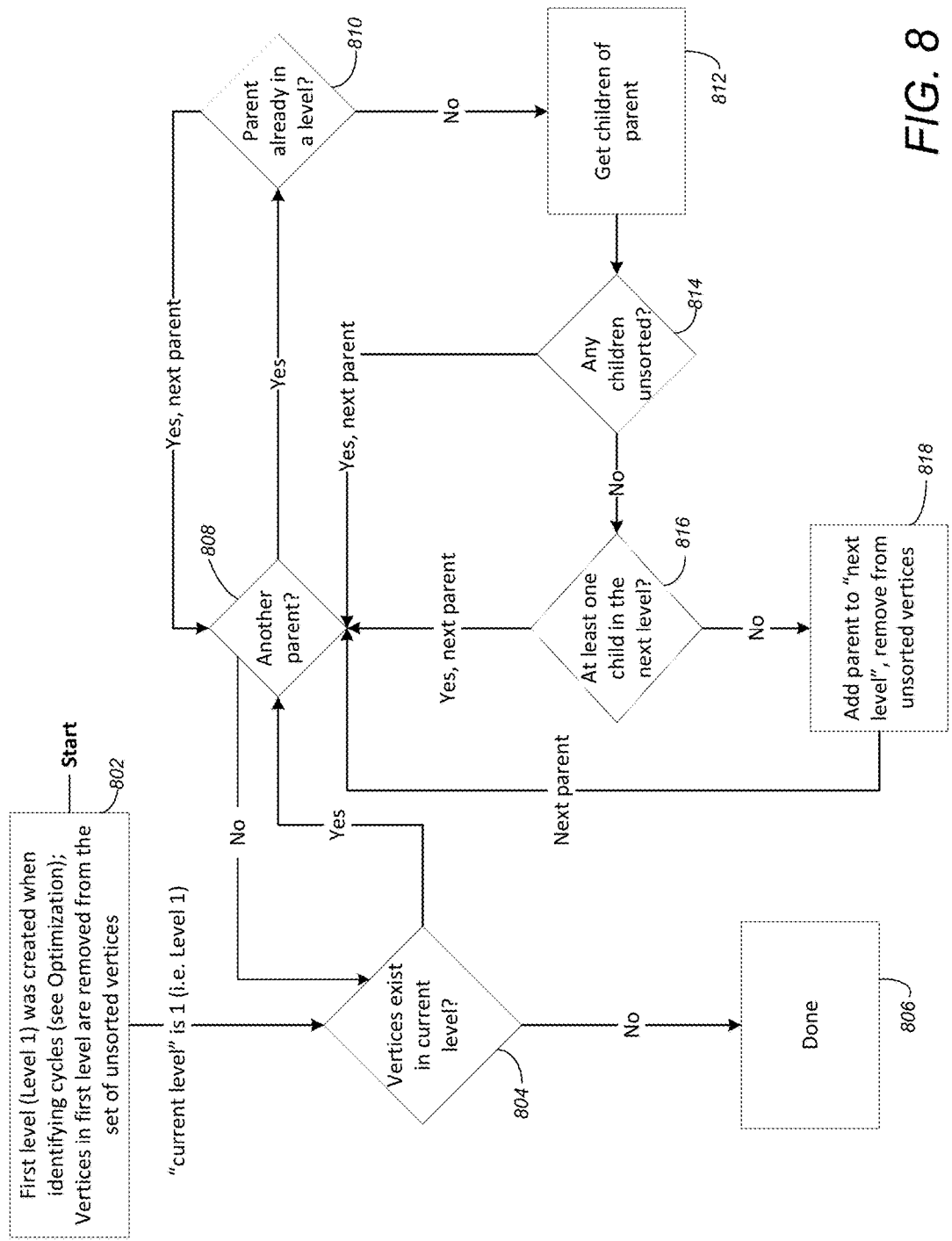
FIG. 8 illustrates the logical flow for leveling a graph once cycles are identified (i.e., details re stage 604 of FIG. 6) in accordance with one or more embodiments of the invention.

FIG. 8 illustrates the logical flow for leveling a graph once cycles are identified (i.e., details re stage 604 of FIG. 6) in accordance with one or more embodiments of the invention. As used herein, an "unsorted vertex" is a vertex that is not in a level yet (all vertices start as unsorted). A "current level" is the latest completed level. The "next level" is the level to which vertices will be added when processing the current level (i.e., "current level+1"). As an overview, the graph is leveled by traversing the graph and assigning all of the nodes into levels (for parallel processing).

The process starts at step 802. The first level (i.e., level 1) was created when identifying cycles (i.e., at step 716 of FIG. 7). At step 802, vertices in the first level are removed from the set of unsorted vertices. Once step 802 has completed, the "current level" is 1 (i.e., level 1). A determination is made at step 804 regarding whether any vertices exist in the current level. If not the process is complete at step 806. If there are vertices that have not been processed/iterated over at the current level, steps 808-816 are iterated for the parents of each vertex in the current level.

At step 808, a determination is made if there is another parent of the vertex. If no more parents exist, the "current level" is incremented and the process returns to step 804. If another parent of a vertex at the current level exists, a determination is made at step 810 regarding whether the parent is already in a level (i.e., if it has already been assigned/grouped into a level). If the parent has already been placed in a level/group, the processing continues with the next parent at step 808. If the parent has not already been assigned to a level, the children of the parent are retrieved at step 812.

A determination is made at step 814 regarding whether any of the retrieved children are unsorted (i.e., have not yet been assigned to a level). If there are some unsorted children, then that vertex cannot be processed (i.e., all children of the vertex have not yet been processed), and the process continues with the next parent in the level at step 808. If there are no unsorted children (i.e., all children of the parent have been assigned to a level), a determination is made at step 816 regarding whether at least one of the children is in the next level. If there is at least one child in the next level, the process continues with the next parent at step 808. Accordingly, step 816 provides that the parent can't be placed in the next level if a child already exists in that level. In this regard, if parents and children were allowed to coexist at the same level, both a parent and child may be processed at the same time in parallel which is inconsistent with the bottom-up processing requirement.

If no children exist at the next level, the parent is added to the "next level" and removed from the list of unsorted vertices at step 818. Thereafter, the process continues executing with the next parent in the list at step 808.

In view of the above, to level the graph: child nodes that do not have any additional child nodes are assigned to the first level and removed from the list of unsorted nodes; a current level is defined as the first level; each parent node of each child node in the current level is analyzed by assigning the analyzed parent node to a next level (from the current level) and removing the analyzed parent node from the set of unsorted nodes IF (i) the analyzed parent node is not already assigned to a level, (ii) no children of the analyzed parent node are in the set of unsorted nodes, and (iii) no children of the analyzed parent node are in the next level. Such steps are then repeated after incrementing the current level.

Thus, FIGS. 7 and 8 break cyclical graph situations followed by the sorting of each vertex/node in a graph into an appropriate level, such that each vertex/node in a level can be executed/processed in parallel with other vertices/nodes at the same level. Thus, the bottom-up approach is conformed to while allowing parallel processing of multiple nodes.

Exemplary Workflow Processing

Figure 3:
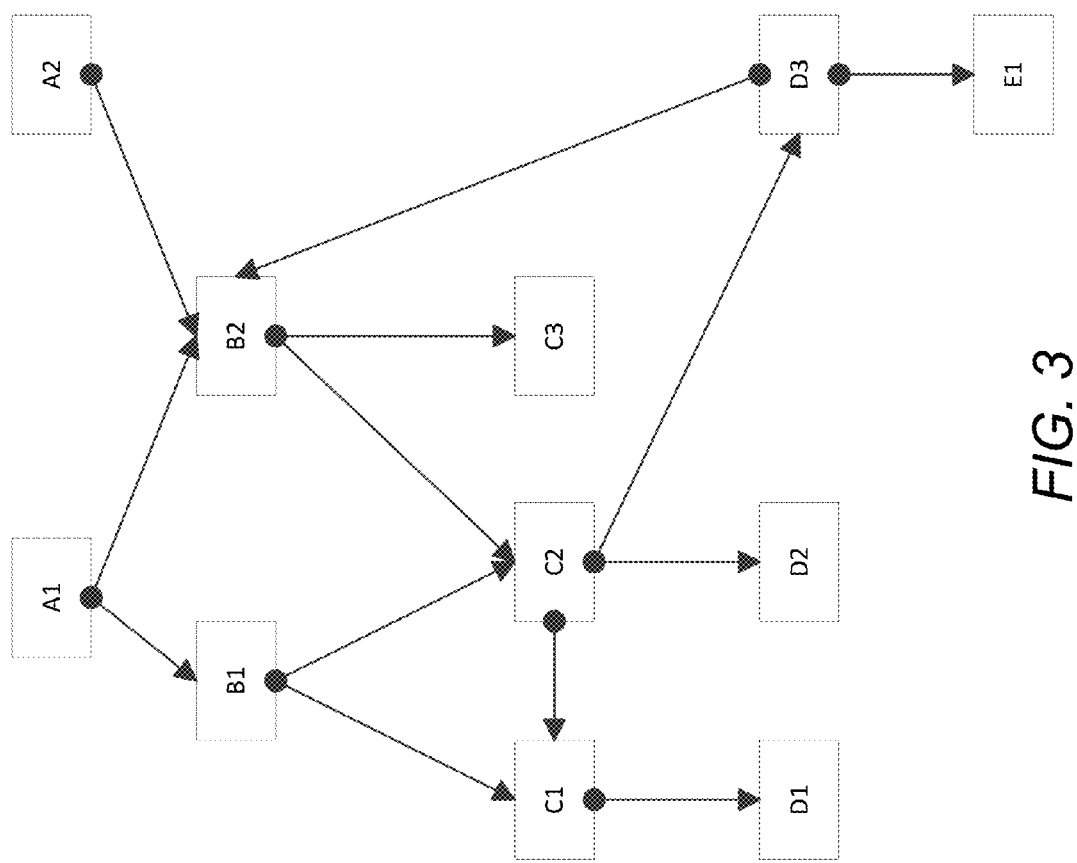
FIG. 3 illustrates a complex graph with a cycle representing a dataset.

FIGS. 9A-9G and 10A-10F illustrate exemplary leveling processes performed on the graph of FIG. 3 in accordance with one or more embodiments of the invention.

Figure 9A:
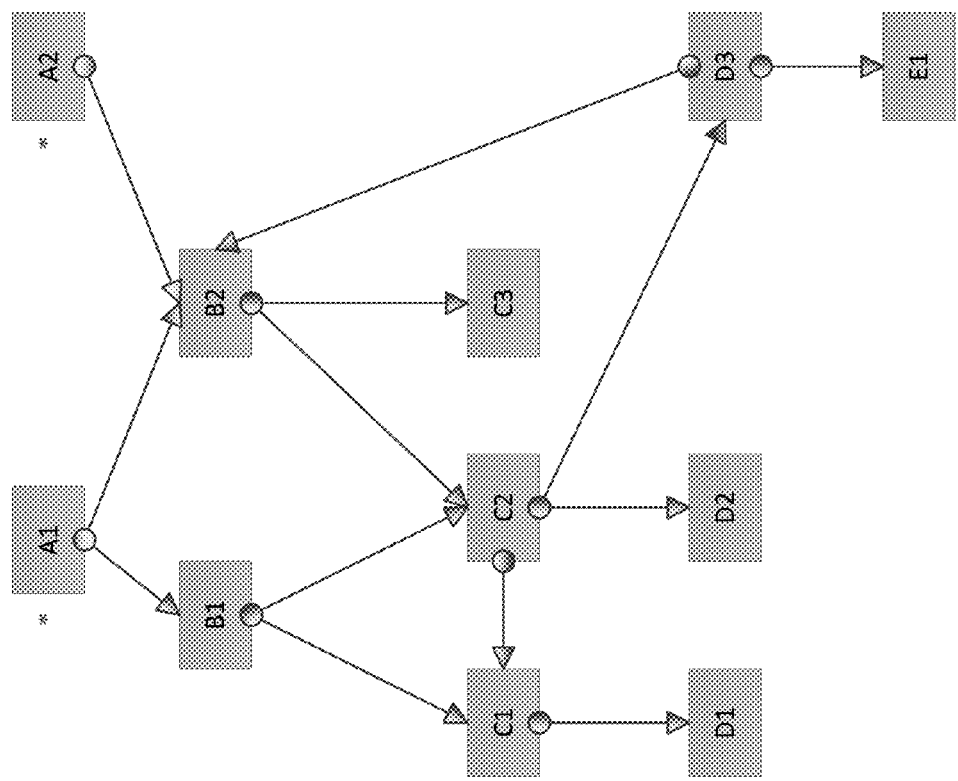

FIG. 9A illustrates the initial graph that will be used in the leveling example. In the execution of the leveling process, A1 and A2 are specified as root vertices (denoted by an asterisk).

Figure 9B:
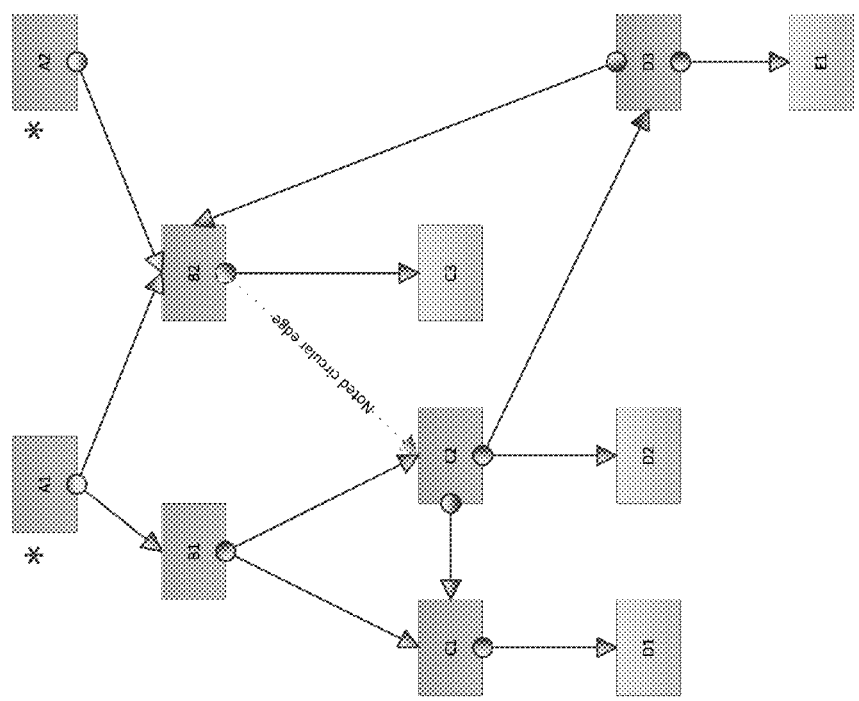

Referring to FIG. 9B, once the graph is built, the next step is to identify the edges that cause cycles (i.e., per the logical flow depicted in FIG. 7). Given the root vertices, the edge from B2 to C2 that causes a cycle is determined (denoted by a dashed line in FIG. 9B) (i.e., step 710 of FIG. 7). With this noted, the process can level the graph as if it has no cycles. As an optimization (i.e., step 716 of FIG. 7), while identifying cycles, the set of leaf vertices that are assigned to the first level are noted/identified/assigned. Accordingly, D1, D2, C3, and E1 may all be assigned to the first level at this stage.

Referring to FIG. 9C, once the first level has been assigned, the remaining vertices can be leveled (while maintaining a knowledge base regarding the circular edges and the vertices that are already in a level). The candidates for the next level are the parents of the vertices in the previous level. Accordingly, it can now be determined that C1 and B2 are effectively leaf vertices (have no unleveled children) and therefore may be placed into the second level.

Figure 9D:
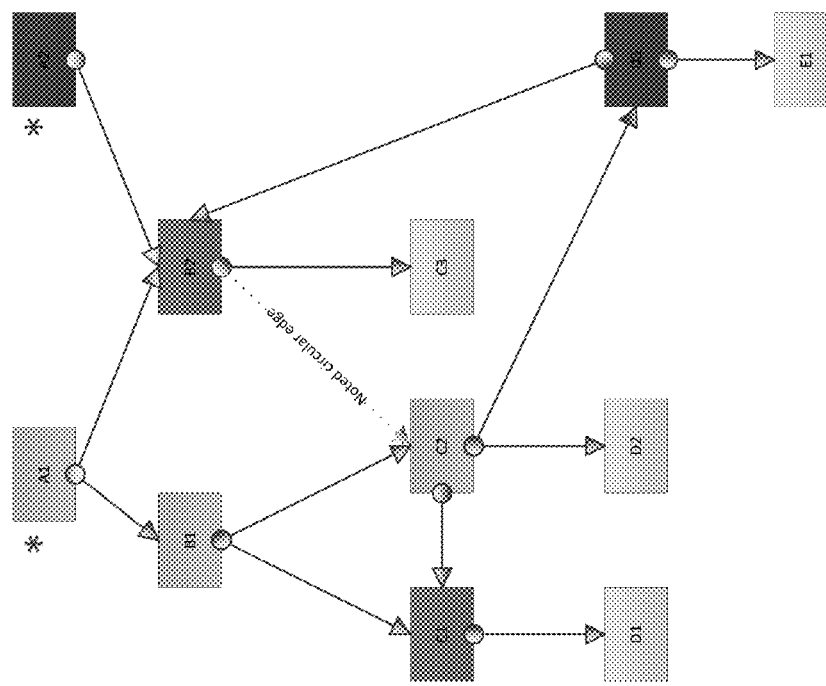

Proceeding to FIG. 9D, following the same guidelines set forth above, one can determine that D3 and A2 are the next leaf vertices. It may be noted that A2 is added to this level (i.e., level 3) even though it is a root vertex. Any vertex is eligible for a level once all of its children are processed into earlier levels.

Figure 9E:
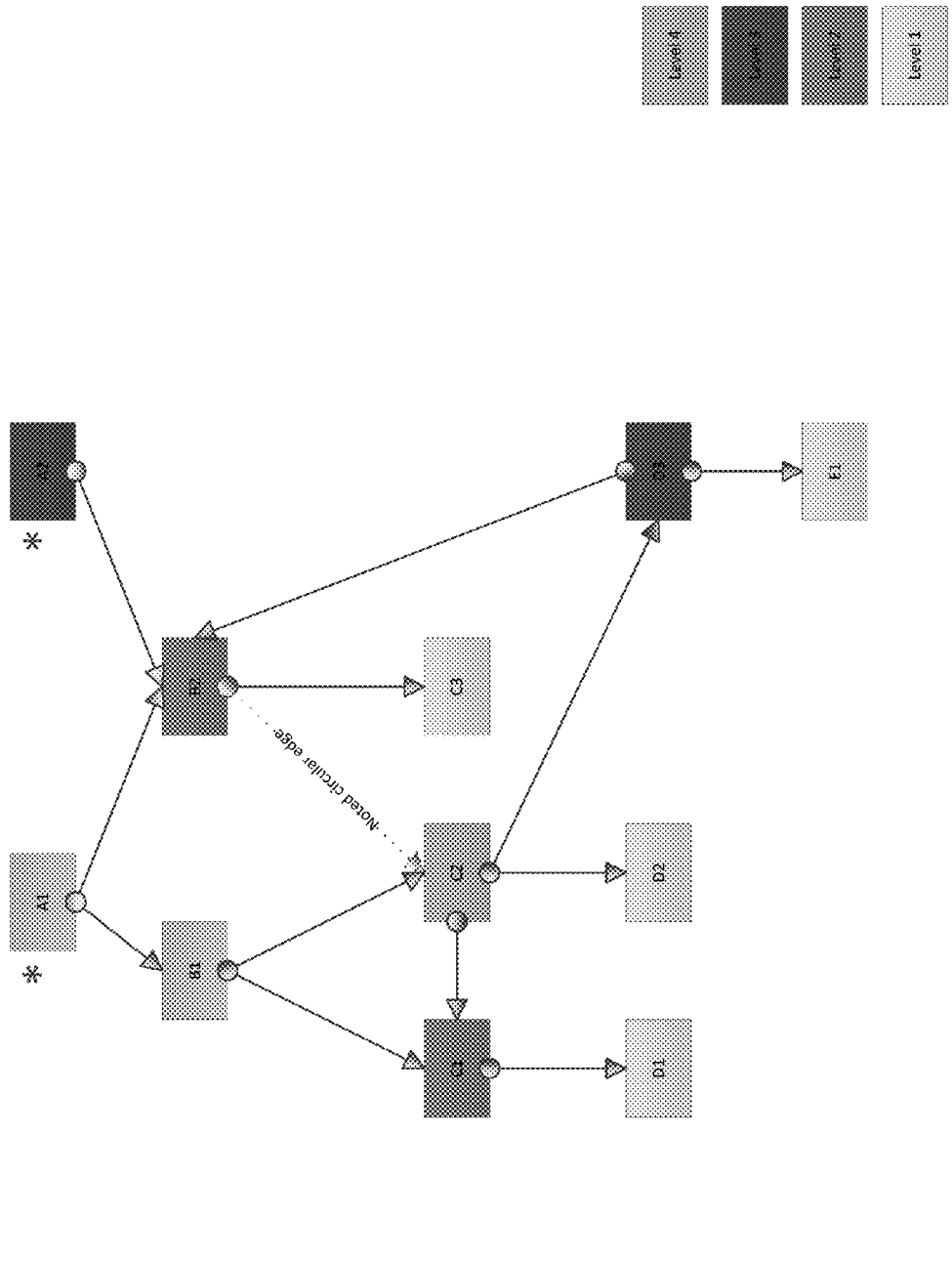

Referring to FIG. 9E, C2 may then be placed into a level (i.e., level 4).

Referring to FIG. 9F, B1 is assigned to a level (i.e., level 5).

Referring to FIG. 9G, A1 is assigned to a level (i.e., level 6). At this point, a graph containing cycles has been efficiently leveled, with circular edges having been noted.

Figure 10A:
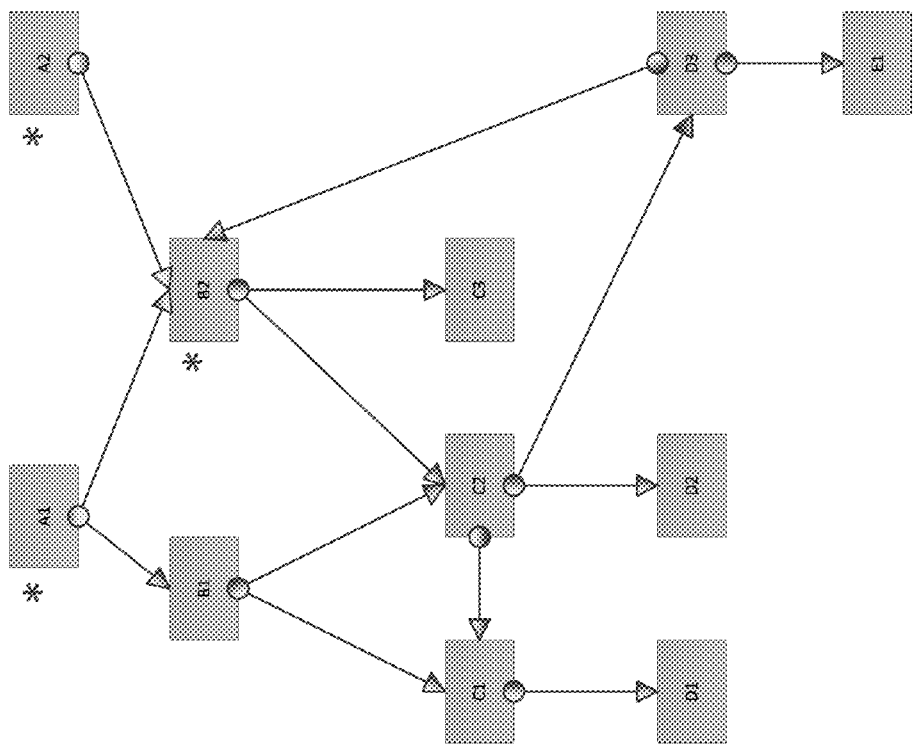

FIGS. 10A-10F illustrate an alternative manner for leveling a graph when different vertices are identified as a set of root vertices. As illustrated in FIG. 10A, B2, A1, and A2 have been identified as root vertices (denoted by an asterisk).

Referring to FIG. 10B, the first step is identifying edges the cause a cycle (i.e., per step 710 of FIG. 7). In this case, the edge from D3 to B2 will be considered a circular edge and will be noted (e.g., depicted as a dashed line in FIG. 10B). The same optimization (i.e., step 716 of FIG. 7) during edge removal will again determine that D1, D2, C3 and E1 are leaf vertices and will be assigned to the first level.

Referring to FIG. 10C, based on the logical flow of FIG. 7, C1 and D3 will be added/assigned to the second level.

As illustrated in FIG. 10D, C2 is the only vertex assigned to the third level.

Figure 10E:
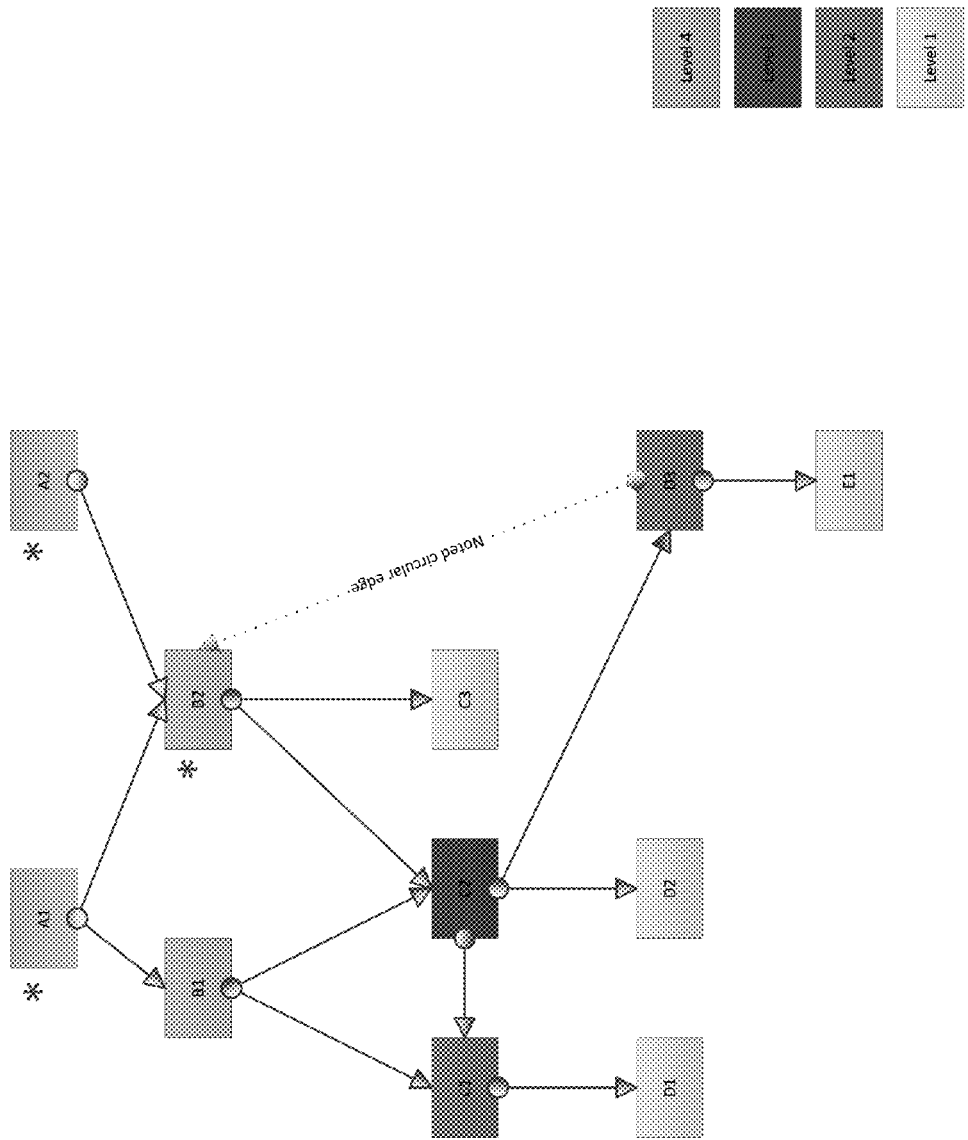

FIG. 10E illustrates that the fourth level will contain B1 and B2.

FIG. 10F, illustrates that the final level will contain A1 and A2. Note that in the example of FIGS. 10A-10F, the methodology determined the need for only five levels instead of six. This shows that different sets of root vertices can result in different sets of levels on the same graph, with both executions of the methodology being equally efficient.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for parallel processing hierarchical data, comprising:
    (a) obtaining the hierarchical data, wherein:
        (i) the hierarchical data is organized in a relationship graph having two or more nodes, wherein the two or more nodes comprise one or more parent nodes and one or more child nodes, wherein the one or more parent nodes are dependent on the one or more child nodes; and
        (ii) the relationship graph requires bottom-up processing wherein before processing a first parent node of the one or more parent nodes, all of the dependent children nodes of the first parent node are processed;
    (b) identifying one or more cycles in the relationship graph, wherein the identifying comprises:
        (i) selecting one node of the two or more nodes;
        (ii) determining that the selected node has not yet been processed;
        (viii) adding the selected node to a path from a current root node to the selected node;
        (iv) maintaining a knowledge base, wherein the knowledge base notes when an edge from the selected node to the child node causes a cycle, and upon causing the cycle, the child node is skipped during a leveling of the relationship graph; and
        (v) adding the selected node to a list of fully processed nodes, removing the selected node from the path, and repeating steps (i)-(v) for a remaining node that is not in the list of fully processed nodes;
    (c) leveling the relationship graph by:
        (i) traversing the relationship graph; and
        (ii) assigning all of the two or more nodes into one or more levels;
        wherein the traversing and assigning comprise:
            (A) assigning child nodes that do not have any additional child nodes to the first level of the one or more levels, and removing the assigned child nodes from a set of unsorted nodes;
            (B) defining a current level as the first level; and
            (C) analyzing each parent node of each child node in the current level by assigning the analyzed parent node to a next level, of the one or more levels, from the current level, and removing the analyzed parent node from the set of unsorted nodes if:
                (i) the analyzed parent node is not already assigned to one or more of the one or more levels;
                (ii) no children of the analyzed parent node are in the set of unsorted nodes; and
                (iii) no children of the analyzed parent node are in the next level; and
        wherein:
            the leveling breaks the one or more cycles; and
            the leveling ensures that each node within a first level of the one or more levels will not depend on anything in the first level or a level above the first level; and
    (d) processing the hierarchical data by parallel processing the nodes in the first level of the one or more levels before parallel processing the nodes in a second level of the one or more levels, wherein:
        (i) the second level is above the first level;
        (ii) each node in the first level can be processed in parallel with other nodes in the first level;
        (iii) the hierarchical data comprises a product design data set for a solid modeling assembly;
        (iv) multiple files relating to each other form a hierarchy of the hierarchical data;
        (v) the processing comprises pushing or pulling the multiple files for the solid modeling assembly to/from a central repository; and
        (vi) the processing maintains integrity of the product design data set.

2. The computer-implemented method of claim 1, wherein the hierarchical data comprises a product design data set.

3. The computer-implemented method of claim 1, wherein the hierarchical data comprises a solid modeling assembly.

4. The computer-implemented method of claim 1, further comprising:
   determining that the selected node has no children nodes; and
   adding the selected node to a first level of the one or more levels.

5. The computer-implemented method of claim 1, further comprising:
   identifying the current root node from the two or more nodes; and
   utilizing the current root node as the selected node.

6. The computer-implemented method of claim 1, further comprising:
   (d) incrementing the current level and repeating step (c)(C).

7. An apparatus for parallel processing hierarchical data in a computer system comprising:
   a computer having a memory;
   an application executing on the computer, wherein the application is configured to:
   (a) obtain the hierarchical data, wherein:
       (i) the hierarchical data is organized in a relationship graph having two or more nodes, wherein the two or more nodes comprise one or more parent nodes and one or more child nodes, wherein the one or more parent nodes are dependent on the one or more child nodes; and
       (ii) the relationship graph requires bottom-up processing wherein before processing a first parent node of the one or more parent nodes, all of the dependent children nodes of the first parent node are processed;
   (b) identify one or more cycles in the relationship graph by:
       (i) selecting one node of the two or more nodes;
       (ii) determining that the selected node has not yet been processed;
       (iii) adding the selected node to a path from a current root node to the selected node;
       (iv) maintaining a knowledge base, wherein the knowledge base notes when an edge from the selected node to the child node causes a cycle, and upon causing the cycle, the child node is skipped during a leveling of the relationship graph; and
       (v) adding the selected node to a list of fully processed nodes, removing the selected node from the path, and repeating steps (i)-(v) for a remaining node that is not in the list of fully processed nodes;
   (c) level the relationship graph by:
       (i) traversing the relationship graph; and
       (ii) assigning all of the two or more nodes into one or more levels;
       wherein the traversing and assigning comprise:
           (A) assigning child nodes that do not have any additional child nodes to the first level of the one or more levels, and removing the assigned child nodes from a set of unsorted nodes;
           (B) defining a current level as the first level; and
           (C) analyzing each parent node of each child node in the current level by assigning the analyzed parent node to a next level, of the one or more levels, from the current level, and removing the analyzed parent node from the set of unsorted nodes if:
               (i) the analyzed parent node is not already assigned to one or more of the one or more levels;
               (ii) no children of the analyzed parent node are in the set of unsorted nodes; and
               (iii) no children of the analyzed parent node are in the next level; and
           wherein:
               the leveling breaks the one or more cycles; and
               the leveling ensures that each node within a first level of the one or more levels will not depend on anything in the first level or a level above the first level; and
   (4) process the hierarchical data by parallel processing the nodes in a first level of the one or more levels before parallel processing the nodes in a second level of the one or more levels, wherein:
       (i) the second level is above the first level;
       (ii) each node in the first level can be processed in parallel with other nodes in the first level;
       (iii) the hierarchical data comprises a product design data set for a solid modeling assembly;
       (iv) multiple files relating to each other form a hierarchy of the hierarchical data;
       (v) the processing comprises pushing or pulling the multiple files for the solid modeling assembly to/from a central repository; and
       (vi) the processing maintains integrity of the product design data set.

8. The apparatus of claim 7, wherein the hierarchical data comprises a product design data set.

9. The apparatus of claim 7, wherein the hierarchical data comprises a solid modeling assembly.

10. The apparatus of claim 7, wherein the application is further configured to:
    determine that the selected node has no children nodes; and
    add the selected node to a first level of the one or more levels.

11. The apparatus of claim 7, the application is further configured to:
    identify the current root node from the two or more nodes; and
    utilize the current root node as the selected node.

12. The apparatus of claim 7, the application is further configured to:
    (d) increment the current level and repeating step (c)(C).

13. A non-transitory computer readable storage medium encoded with computer program instructions which when accessed by a computer cause the computer to load the program instructions to a memory therein creating a special purpose data structure causing the computer to operate as a specially programmed computer, executing a method of parallel processing hierarchical data, comprising:
    (a) obtaining, in the specially programmed computer, the hierarchical data, wherein:
        (i) the hierarchical data is organized in a relationship graph having two or more nodes, wherein the two or more nodes comprise one or more parent nodes and one or more child nodes, wherein the one or more parent nodes are dependent on the one or more child nodes; and
        (ii) the relationship graph requires bottom-up processing wherein before processing a first parent node of the one or more parent nodes, all of the dependent children nodes of the first parent node are processed;

(b) identifying, in the specially programmed computer, one or more cycles in the relationship graph by:
  (i) selecting one node of the two or more nodes;
  (ii) determining that the selected node has not yet been processed;
  (iii) adding the selected node to a path from a current root node to the selected node;
  (iv) maintaining a knowledge base, wherein the knowledge base notes when an edge from the selected node to the child node causes a cycle, and upon causing the cycle, the child node is skipped during a leveling of the relationship graph; and
  (v) adding the selected node to a list of fully processed nodes, removing the selected node from the path, and repeating steps (i)-(v) for a remaining node that is not in the list of fully processed nodes;
(c) leveling, in the specially programmed computer, the relationship graph by:
  (i) traversing the relationship graph; and
  (ii) assigning all of the two or more nodes into one or more levels;
  wherein the traversing and assigning comprise:
    (A) assigning child nodes that do not have any additional child nodes to the first level of the one or more levels, and removing the assigned child nodes from a set of unsorted nodes;
    (B) defining a current level as the first level; and
    (C) analyze each parent node of each child node in the current level by assigning the analyzed parent node to a next level, of the one or more levels, from the current level, and removing the analyzed parent node from the set of unsorted nodes if:
      (i) the analyzed parent node is not already assigned to one or more of the one or more levels;
      (ii) no children of the analyzed parent node are in the set of unsorted nodes; and
      (iii) no children of the analyzed parent node are in the next level;
  wherein:
    the leveling breaks the one or more cycles; and
    the leveling ensures that each node within a first level of the one or more levels will not depend on anything in the first level or a level above the first level; and
(d) processing, in the specially programmed computer, the hierarchical data by parallel processing the nodes in a first level of the one or more levels before parallel processing the nodes in a second level of the one or more levels, wherein:
  (i) the second level is above the first level;
  (ii) each node in the first level can be processed in parallel with other nodes in the first level;
  (iii) the hierarchical data comprises a product design data set for a solid modeling assembly;
  (iv) multiple files relating to each other form a hierarchy of the hierarchical data;
  (v) the processing comprises pushing or pulling the multiple files for the solid modeling assembly to/from a central repository; and
  (vi) the processing maintains integrity of the product design data set.

14. The non-transitory computer readable storage medium of claim 13, wherein the hierarchical data comprises a product design data set.

15. The non-transitory computer readable storage medium of claim 13, wherein the hierarchical data comprises a solid modeling assembly.

16. The non-transitory computer readable storage medium of claim 13, wherein the method further comprises:
  determining that the selected node has no children nodes; and
  adding the selected node to a first level of the one or more levels.

17. The non-transitory computer readable storage medium of claim 13, wherein the method further comprises:
  identifying the current root node from the two or more nodes; and
  utilizing the current root node as the selected node.

18. The non-transitory computer readable storage medium of claim 13, wherein the method further comprises:
  (d) incrementing the current level and repeating step (c)(C).

* * * * *